US011139262B2

(12) United States Patent
Tuttle et al.

(10) Patent No.: US 11,139,262 B2
(45) Date of Patent: Oct. 5, 2021

(54) USE OF PRE-CHANNELED MATERIALS FOR ANISOTROPIC CONDUCTORS

(71) Applicant: Micron Technology, Inc., Boise, ID (US)

(72) Inventors: Mark E. Tuttle, Meridian, ID (US); John F. Kaeding, Boise, ID (US); Owen R. Fay, Meridian, ID (US); Eiichi Nakano, Boise, ID (US); Shijian Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/270,112

(22) Filed: Feb. 7, 2019

(65) Prior Publication Data

US 2020/0258859 A1    Aug. 13, 2020

(51) Int. Cl.
*H01L 21/76* (2006.01)
*H01L 21/56* (2006.01)
*H01L 23/00* (2006.01)

(52) U.S. Cl.
CPC .............. *H01L 24/32* (2013.01); *H01L 24/29* (2013.01); *H01L 24/33* (2013.01); *H01L 2224/29078* (2013.01); *H01L 2224/32105* (2013.01); *H01L 2224/3303* (2013.01); *H01L 2224/3313* (2013.01); *H01L 2224/33107* (2013.01); *H01L 2924/381* (2013.01)

(58) Field of Classification Search
CPC ......... H01L 24/32; H01L 24/29; H01L 24/33; H01L 2224/29078; H01L 2224/32105; H01L 2224/3303; H01L 2224/33107; H01L 2224/3313; H01L 2924/381
USPC ........ 257/774; 438/629, 637, 639, 640, 667, 438/668, 672, 675, 700, 701, 713, 978
See application file for complete search history.

(56) References Cited

U.S. PATENT DOCUMENTS

| | | | | |
|---|---|---|---|---|
| 8,008,582 | B2* | 8/2011 | Shimada | H01L 23/49827 174/257 |
| 2002/0084522 | A1* | 7/2002 | Yoshizawa | H01L 24/29 257/692 |
| 2002/0100974 | A1* | 8/2002 | Uchiyama | H01L 24/11 257/737 |

(Continued)

*Primary Examiner* — Sheikh Maruf
(74) *Attorney, Agent, or Firm* — Perkins Coie LLP

(57) ABSTRACT

A semiconductor device assembly has a first substrate, a second substrate, and an anisotropic conductive film. The first substrate includes a first plurality of connectors. The second substrate includes a second plurality of connectors. The anisotropic conductive film is positioned between the first plurality of connectors and the second plurality of connectors. The anisotropic conductive film has an electrically insulative material and a plurality of interconnects laterally separated by the electrically insulative material. The plurality of interconnects forms electrically conductive channels extending from the first plurality of connectors to the second plurality of connectors. A method includes connecting the plurality of interconnects to the first plurality of connectors and the second plurality of connectors, such that the electrically conductive channels are operable to conduct electricity from the first substrate to the second substrate. The method may include passing electrical current through the plurality of interconnects.

19 Claims, 4 Drawing Sheets

(56) References Cited

U.S. PATENT DOCUMENTS

| | | | |
|---|---|---|---|
| 2005/0077542 A1* | 4/2005 | Asai | G01R 1/07371 257/200 |
| 2006/0113656 A1* | 6/2006 | Uang | H01L 25/0657 257/690 |
| 2007/0090725 A1* | 4/2007 | Kamiyama | H03H 9/172 310/324 |
| 2007/0093229 A1* | 4/2007 | Yamakawa | H01L 25/16 455/333 |
| 2011/0095419 A1* | 4/2011 | Horiuchi | H05K 3/3436 257/737 |
| 2011/0117357 A1* | 5/2011 | Hatanaka | H01L 24/83 428/312.8 |
| 2011/0236659 A1* | 9/2011 | Fuju | B32B 7/02 428/213 |
| 2012/0018900 A1* | 1/2012 | Pagaila | H01L 24/19 257/774 |
| 2012/0086127 A1* | 4/2012 | Shu | H01L 25/0657 257/773 |
| 2013/0020719 A1* | 1/2013 | Jung | H01L 25/0657 257/774 |
| 2013/0069245 A1* | 3/2013 | Uchiyama | H01L 21/568 257/774 |
| 2013/0168871 A1* | 7/2013 | Kim | H01L 25/105 257/774 |
| 2015/0130078 A1* | 5/2015 | Hong | H01L 23/3128 257/774 |
| 2016/0020170 A1* | 1/2016 | Ho | H01L 23/481 257/774 |
| 2016/0056101 A1* | 2/2016 | Jee | H01L 21/56 257/737 |
| 2016/0163564 A1* | 6/2016 | Yu | H01L 23/5386 257/774 |
| 2016/0163650 A1* | 6/2016 | Gao | H01L 21/486 257/773 |
| 2016/0197023 A1* | 7/2016 | Teshima | H01L 29/7813 257/288 |
| 2016/0218064 A1* | 7/2016 | Kim | H01L 25/50 |
| 2016/0219712 A1* | 7/2016 | Ko | H01L 24/13 |
| 2016/0240454 A1* | 8/2016 | Perkins | H01L 23/4821 |
| 2016/0247767 A1* | 8/2016 | Kim | H01L 24/83 |
| 2017/0047266 A1* | 2/2017 | Ihara | H01L 23/367 |
| 2017/0062370 A1* | 3/2017 | Shiraki | H01L 23/49816 |
| 2017/0092680 A1* | 3/2017 | Kwon | H01L 23/5226 |
| 2017/0125330 A1* | 5/2017 | Hotta | H01L 23/49827 |
| 2018/0350769 A1* | 12/2018 | Yamashita | H01L 21/76877 |
| 2019/0148276 A1* | 5/2019 | Chen | H01L 24/81 257/774 |
| 2019/0148301 A1* | 5/2019 | Huang | H01L 23/5386 257/774 |

* cited by examiner

USE OF PRE-CHANNELED MATERIALS FOR ANISOTROPIC CONDUCTORS

FIELD

The embodiments described herein relate to anisotropic conductors that may increase reliability and conductivity between substrates and methods of using such anisotropic conductors.

BACKGROUND

Semiconductor processing and packaging techniques continue to evolve to meet industry demands for increased performance, reduced cost, and/or reduced size. Electronic products, such as cell phones, smart phones, tablets, personal digital assistants, laptop computers, as well as other electronic devices, may utilize packaged semiconductor assemblies having a high density of devices while having a relatively small footprint. In order to connect two substrates together, semiconductor assemblies may utilize an anisotropic conductive film, also known as ACF tape, to conduct electricity through the thickness of the film.

FIG. 8 shows semiconductor device assembly 100 with ACF tape 120 positioned between connectors 102 of first substrate 101 and connectors 112 of second substrate 111. ACF tape 120 may contain an adhesive 122 that is filled with conductive particles 121. The adhesive 122 forms a mechanical connection between the connectors 102 of first substrate 101 and connectors 112 of second substrate 111. First substrate 101 has a spacing 106, which is the distance between adjacent connectors 102 of first substrate 101. Second substrate 111 has a spacing 116, which is the distance between adjacent connectors 112 of second substrate 111. Spacing 106 between the connectors 102 of first substrate 101 is selected based on the size and density of conductive particles 121. For example, a larger spacing 106 may be required as the particle size and/or density increases.

FIG. 9 shows ACF tape 120 electrically connecting first substrate 101 to second substrate 111. Before application, the conductive particles 121 are not operable to provide electrical interconnection through the thickness of ACF tape 120. During the application process, conductive particles 121 positioned between connectors 102 of first substrate 101 and connectors 112 of second substrate 111 are compressed into compressed conductive particles 123. As adhesive 122 cures, ACF tape 120 mechanically bonds first substrate 101 to second substrate 111 and compressed conductive particles 123 remain in a compressed state. One or more compressed conductive particles 123 form an electrical connection between connectors 102 of first substrate 101 and connectors 112 of second substrate 111 in the z-direction. However, the size of conductive particles 121, and thus compressed conductive particles 123, limits spacing 106 of the connectors 102 of first substrate 101.

As shown in FIG. 9, connectors 102 on first substrate 101 include a first connector 103, a second connector 104, and a third connector 105 and connectors 112 on second substrate 111 include a first connector 113, a second connector 114, and a third connector 115. Compressed conductive particles 123 form electrical connections in the z-direction between first connector 103 of first substrate 101 and first connector 113 of second substrate 111, and between second connector 104 of first substrate 101 and second connector 114 of second substrate 111. However, the density of conductive particles 121 may form a group 124 that also creates an electrical connection in the x-direction and/or y-direction and causes undesirable shorting between adjacent connectors. The likelihood of shorting may be reduced by increasing spacing 106 of connectors 102 of first substrate 101 and spacing 116 of connectors 112 of second substrate 111, which may increase the overall size of semiconductor device assembly 100.

Furthermore, the distribution of conductive particles 121 may be insufficient to create an electrical connection between certain connectors. As shown in FIG. 9, the distribution of conductive particles 121 in a gap 125 (best shown in FIG. 8) between the third connector 105 of first substrate 101 and the third connector 115 of second substrate 111 may be inadequately dispersed in ACF tape 120. Therefore, ACF tape 120 may be highly alignment-dependent and/or require more labor-intensive methods to achieve an adequate distribution of conductive particles 121. Additional drawbacks and disadvantages may exist.

Figure 1:
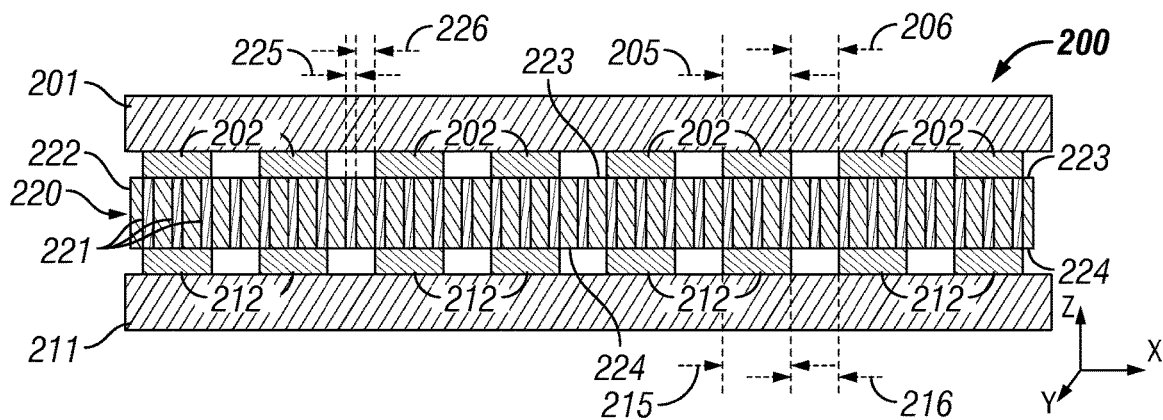
FIG. 1 is a schematic of an embodiment of a semiconductor device assembly with an anisotropic conductive film connecting a plurality of substrates.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices and semiconductor device packages may not be shown and/or may not be described in detail to avoid obscuring other aspects of the disclosure. In general, it should be understood that various other devices, systems, and/or methods in addition to those specific embodiments disclosed herein may be within the scope of the present disclosure.

The terms "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. Additionally, orthogonal x-, y-, and z-directions may also be used for the purposes of illustration, with the z-direction being referred to as "vertical" and the x- and y-directions being referred to as "lateral." These terms, however, should be construed broadly to include semiconductor devices and/or semiconductor device assemblies having other orientations, such as inverted or inclined orientations where top/bottom, over/under, above/below, up/down, and left/right can be interchanged depending on the orientation. Furthermore, it should be understood that the figures herein are not necessary drawn to scale or uniform and certain features may be exaggerated for ease of illustration. The shapes, sizes, configurations, and/or locations of elements are shown for illustrative purposes and may be varied as would be appreciated by one of ordinary skill in the art having the benefit of this disclosure.

Various embodiments of this disclosure are directed to semiconductor devices, semiconductor device assemblies, semiconductor packages, semiconductor device packages, and methods of making and/or operating semiconductor devices.

An embodiment of a semiconductor device assembly includes a first substrate, a second substrate, and an anisotropic conductive film. The first substrate includes a first plurality of connectors. The second substrate includes a second plurality of connectors. The anisotropic conductive film is positioned between the first plurality of connectors and the second plurality of connectors. The anisotropic conductive film has an electrically insulative material and a plurality of interconnects laterally separated by the electrically insulative material. The plurality of interconnects forms electrically conductive channels extending from the first plurality of connectors to the second plurality of connectors.

An embodiment of an anisotropic conductive film includes an upper portion, a lower portion, a plurality of interconnects, and an electrically insulative material. The plurality of interconnects extend from the upper portion to the lower portion. Each interconnect forms an electrically conductive channel before application to a substrate. The plurality of interconnects are lateral separated by the electrically insulative material.

An embodiment of a method of making a semiconductor device assembly includes providing a first substrate, providing a second substrate, and providing an anisotropic conductive film. The first substrate has a first plurality of connectors. The second substrate has a second plurality of connectors. The anisotropic conductive film has a plurality of interconnects. The plurality of interconnects are laterally separated by an electrically insulative material and form a plurality of electrically conductive channels. The method includes connecting the plurality of interconnects to the first plurality of connectors and the second plurality of connectors, wherein the electrically conductive channels are operable to conduct electricity from the first substrate to the second substrate. The method includes passing electrical current between the first substrate and the second substrate through the plurality of interconnects.

FIG. 1 is a schematic in the XZ-plane of an embodiment of a semiconductor device assembly 200. Semiconductor device assembly 200 includes a first substrate 201 and a second substrate 211. First substrate 201 includes a plurality of connectors 202. Second substrate 211 includes a plurality of connectors 212 in electrical communication with the plurality of connectors 202 of first substrate 201. First substrate 201 and/or second substrate 211 may be a semiconductor device as would be appreciated by one of ordinary skill in the art having the benefit of this disclosure.

The plurality of connectors 202 of first substrate 201 have a width 205. A pitch of the plurality of connectors 202 is a distance between the centers of adjacent connectors 202. Width 205 of the plurality of connectors 202 of first substrate 201 may be uniform. As used herein, the term "uniform" includes both equal characteristics as well as repeating patterns of characteristics. First substrate 201 has a spacing 206, which is the distance between adjacent connectors 202 of first substrate 201. Spacing 206 between each adjacent pair of connectors 202 of first substrate 201 may be uniform. The plurality of connectors 212 of second substrate 211 have a width 215. A pitch of the plurality of connectors 212 is a distance between the centers of adjacent connectors 212. Width 215 of the plurality of connectors 212 of second substrate 211 may be uniform. In some embodiments, width 215 of the plurality of connectors 212 of second substrate 211 is equal to width 205 of the plurality of connectors 202 of first substrate 201. Second substrate 211 has a spacing 216, which is the distance between adjacent connectors 212 of second substrate 211. Spacing 216 between each adjacent pair of connectors 212 of second substrate 211 may be uniform. In some embodiments, spacing 206 of the plurality of connectors 202 of first substrate 201 is equal to spacing 216 of the plurality of connectors 212 of second substrate 211.

Figure 2:
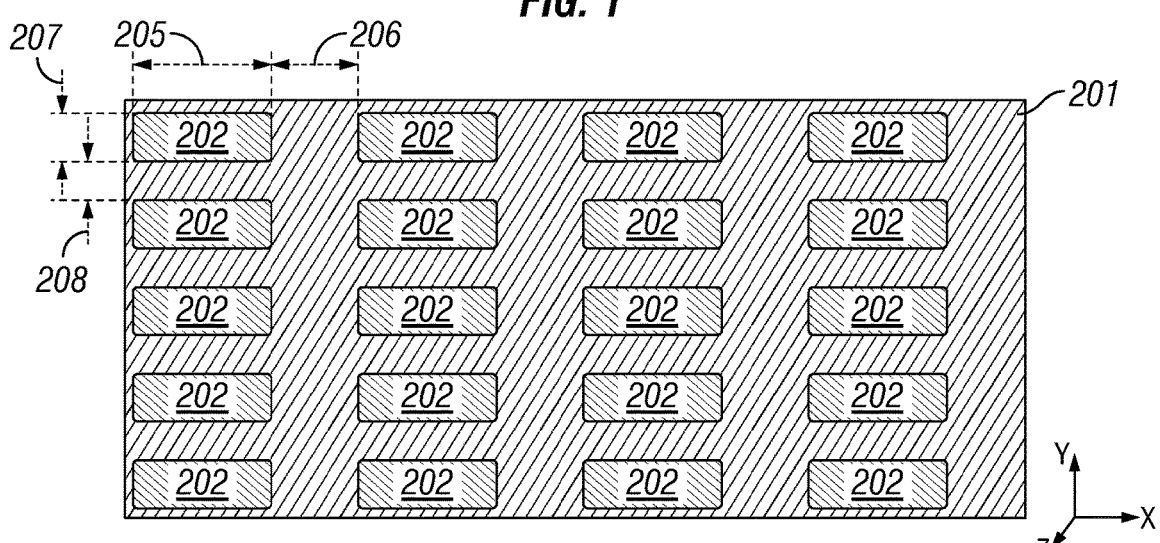
FIG. 2 is a schematic of an embodiment of a substrate with a plurality of connectors.

FIG. 2 shows a portion of first substrate 201 and the plurality of connectors 202 of first substrate 201 in the XY-plane. The plurality of connectors 202 of first substrate 201 have a width 207. Width 207 of the plurality of connectors 202 of first substrate 201 may be uniform. Width 205 is referenced in the x-direction and width 207 is referenced in the y-direction. First substrate 201 has a spacing 208, which is the distance between adjacent connectors 202 of first substrate 201. Spacing 208 between each adjacent pair of connectors 202 of first substrate 201 may be uniform. Spacing 206 is orientated in the x-direction and spacing 208 is referenced in the y-direction. Spacing 206 may be equal to spacing 208. Connectors 212 of second substrate 211 also have widths and spacings in both the x-direction and the y-direction as would be appreciated by one of ordinary skill in the art having the benefit of this disclosure.

Figure 8:
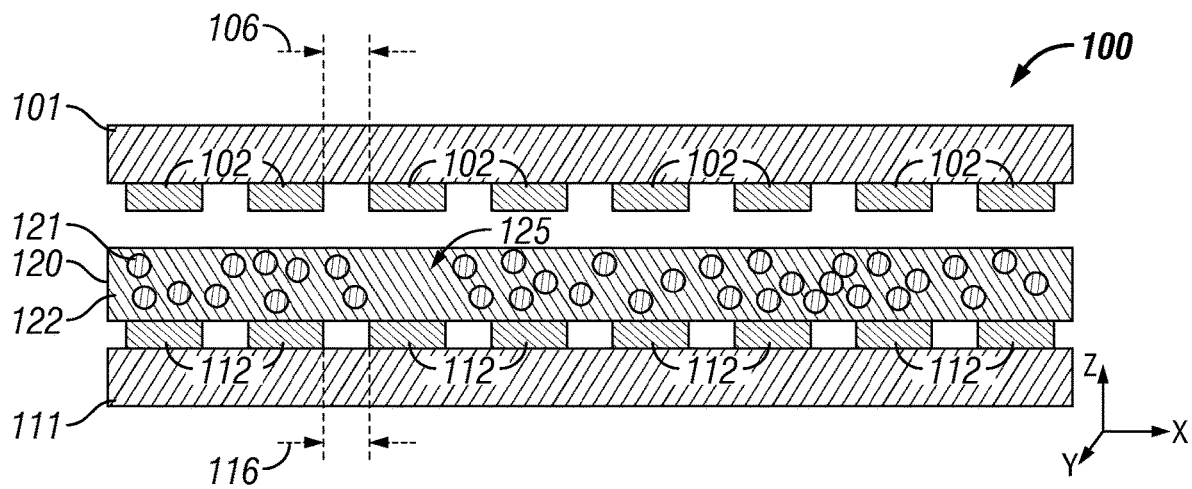
FIG. 8 is a schematic of a semiconductor device assembly with ACF tape having conductive particles positioned between connectors of a first substrate and connectors of a second substrate.
Figure 9:
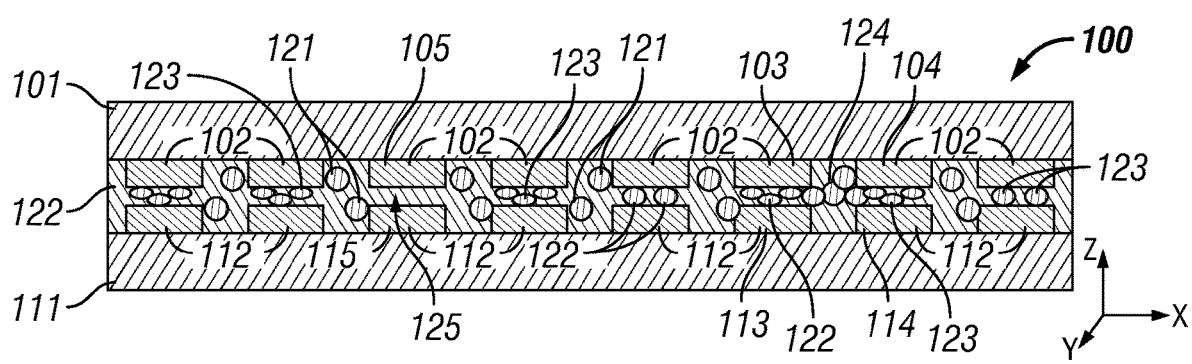
FIG. 9 is a schematic of a semiconductor device assembly with ACF tape having conductive particles compressed between connectors of a first substrate and connectors of a second substrate.

Referring again to FIG. 1, the plurality of connectors 202 of first substrate 201 are electrically connected to the plurality of connectors 212 of second substrate 211 via an anisotropic conductive film 220. Anisotropic conductive film 220 includes a plurality of interconnects 221 extending in the z-direction. The plurality of interconnects 221 are vertically oriented and form a plurality of electrically conductive channels through the thickness of anisotropic conductive film 220. As used herein, the term "pre-channeled" means that the plurality of interconnects 221 are operable to provide electrical interconnection when the ends are of the plurality of interconnects 221 are placed into contact with the connectors desired to be electrically connected. In contrast, conductive particles 121 shown in FIGS. 8 and 9 are not pre-channeled since they are not operable to provide electrical interconnection without compressing conductive particles 121 together after being applied to a substrate.

Figure 3:
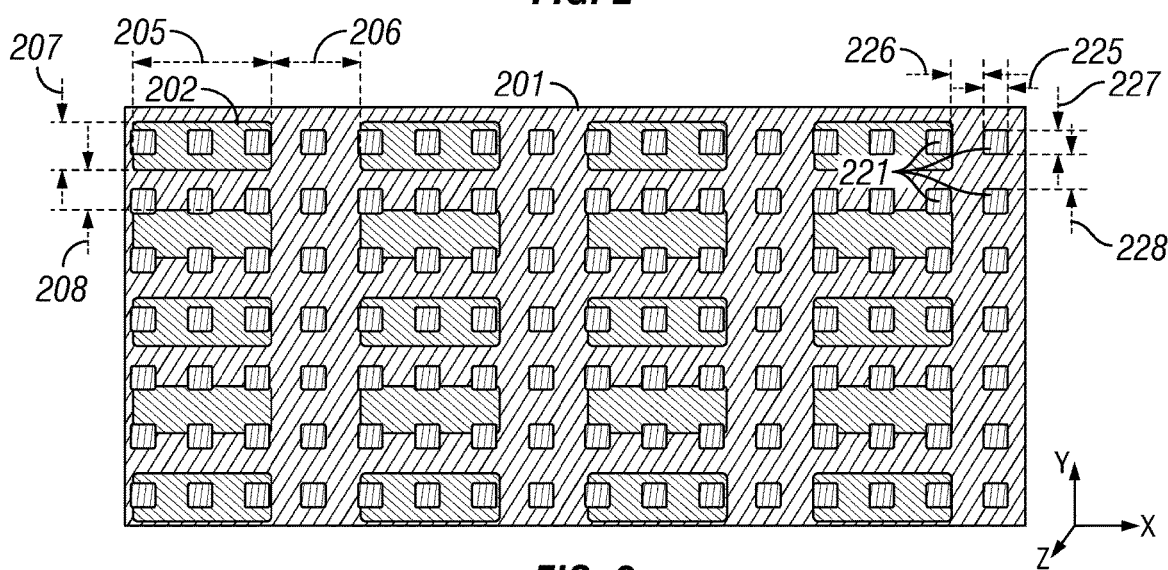
FIG. 3 is a schematic of the substrate of FIG. 2 with an array of electrical interconnects positioned across the substrate.

In the x-direction, the plurality of interconnects 221 have a width 225 and a spacing 226, which is the distance between adjacent interconnects 221. Spacing 226 between each pair of adjacent interconnects 221 may be uniform. FIG. 3 is a schematic in the XZ-plane of an embodiment of an array of interconnects 221 aligned with first substrate 201. For purposes of illustration, the array of interconnects 221 has not been shown aligned with second substrate 211 in FIG. 3, but a person of ordinary skill in the art having the benefit of this disclosure would appreciated that the plurality of interconnects 221 are also aligned with second substrate 111. The plurality of interconnects 221 have a width 225 and a spacing 226 referenced in the x-direction, and a width 227 and a spacing 228 referenced in the y-direction. The shape of the array of interconnects 221 is formed by width 225 and spacing 226 in the x-direction and width 227 and spacing 228 in the y-direction. The shape of the array of connectors 202 of first substrate 201 is formed of width 205 and spacing 206 in the x-direction and width 207 and spacing 208 in the y-direction.

Referring again to FIG. 1, the plurality of interconnects 221 provide for electrical communication through anisotropic conductive film 220. In operation, anisotropic conductive film 220 is positioned between first substrate 201 and second substrate 211. At least a portion of the plurality of interconnects 221 are aligned with a connector 202 of first substrate 201 and a connector 212 of second substrate 211. An interconnect 221 is operably connected to the one connector 202 of first substrate 201 and one connector 212 of second substrate 211 such that an electrical communication path is established through interconnect 221. By way of example, interconnect 221 may be electrically connected to connector 202 of first substrate 201 via solder. In some embodiments, multiple interconnects 221 are operably connected between one connector 202 of first substrate 201 and one connector 212 of second substrate 211, and form a plurality of electrically conductive channels therebetween.

The plurality of interconnects 221 are laterally separated in an electrically insulative material. As used herein, the term "electrically insulative material" means a material suitable for preventing electrical current from flowing between adjacent interconnects 221. Anisotropic conductive film 220 may be an electrically insulating microporous film 222 and the plurality of interconnects 221 may be vertical pores, such as a channel, extending through the microporous film 222. The plurality of interconnects 221 extend through a thickness, in the z-direction, of the microporous film 222 to provide for electrical communication between an upper portion 223 and a lower portion 224. In some embodiments, the microporous film 222 may be formed of a polyethylene or a polypropylene. In some embodiments, the microporous film 222 may be an acrylic-based or epoxy-based film. The plurality of interconnects 221 are formed of an electrically conductive material suitable for use in integrated circuits. For example, the plurality of interconnects 221 may be formed of nickel, copper, solder, or gold. The plurality of interconnects 221 may be formed through electroless plating. By way of example, the microporous film 222 may be electroless plated with nickel, copper, or gold post palladium activation. The microporous film 222 may have a thickness, in the z-direction, of between two and two-hundred microns.

In some embodiments, the microporous film 222 may include an adhesive that assists with physical connection between first substrate 201 and second substrate 211 and providing a connection between the plurality of interconnects 221 and connectors 202 of first substrate 201 and connectors 212 of second substrate 211. In other embodiments, the microporous film 222 does not include an adhesive, and the connections between the plurality of interconnects 221 and connectors 202 of first substrate 201 and connectors 212 of second substrate 211 may provide a physical connection therebetween. Therefore, the use of adhesive may be reduced. Additional connectors 202 of first substrate 201 may be provided for the purpose of establishing additional physical connections and may not be operable to receive or supply an electrical communication.

The microporous film 222 may be a flexible film to conform to the shape of first substrate 201 and/or second substrate 211. In some embodiments, the microporous film 222 may be a non-flexible material, such as glass or ceramic. A non-flexible microporous film 222 may provide additional structural activity and/or reduce the stress caused by the coefficient of thermal expansion (CTE) mismatch between materials.

The widths and spacings of connectors 202 of first substrate 201, connectors 212 of second substrate 211, and interconnects 221 may be selected based upon the desired configuration of semiconductor device assembly 200. In some embodiments, width 205 of connectors 202 of first substrate 201 are approximately a micron and width 225 of the plurality of interconnects are submicron. In a semiconductor device assembly where overall size is desired to be minimized, the array of connectors 202 of first substrate 201 may substantially correspond to the array of interconnects 221. Smaller tolerances may be utilized when applying anisotropic conductive film 220 to first substrate 201 and second substrate 211. Width 225 and spacing 226 of interconnect 221 are selected to provide electrical communication between a connector 202 on first substrate 201 and second substrate 211 without interconnect 221 contacting adjacent connectors 202 on first substrate 201 or adjacent connectors 212 on second substrate 211.

Manufacturing advantages and efficiencies may be gained by providing an anisotropic conductive film 220 that may be applied with greater manufacturing flexibilities, such as greater tolerances or at different orientations, without shorting adjacent connectors 202, 212. As shown in FIG. 3, spacing 226 of the plurality of interconnects 221 is less than width 205 of connector 202 of first substrate 201, such that at least one interconnect 221 will align with connector 202 of first substrate 201 in the x-direction. Additionally, spacing 228 of the plurality of interconnects 221 is less than width 207 of connector 202 of first substrate 201, such that at least one interconnect 221 will align with connector 202 of first substrate 201 in the y-direction. Spacing 226 and width 225 of interconnects 221 and spacing 206 and width 205 of the connectors 202 may be selected in the x-direction and spacing 228 and width 227 of interconnects 221 and spacing 208 and width 207 of the connectors 202 may be selected in the y-direction such that the full cross-sectional area of at least one of the interconnects 221 is aligned with each connector 202. The array of interconnects 221 may be offset in the x-direction and/or the y-direction and still maintain alignment with connectors 202. If a spacing of the plurality of interconnects 221 is less than a width of connector 202 of first substrate 201 in a direction, greater tolerances may be utilized along that direction when applying anisotropic conductive film 220 (shown in FIG. 1) to first substrate 201 and second substrate 211, without shorting adjacent connectors 202, 212.

In some embodiments, spacing 226 and spacing 228 of the plurality of interconnects 221 may each be less than each of width 205 and width 207 of connectors 202 of first substrate 201. In some embodiments, width 205 in the x-direction may be equal to width 207 in the y-direction. Spacing 226 may be equal to spacing 228. When the spacings 226, 228 of the plurality of interconnects 221 are both less than the widths 205, 207 of connectors 202 of first substrate 201, anisotropic conductive film 220 (shown in FIG. 1) may be applied with its x-direction aligned with either the x-direction or the y-direction of the array of connectors 202 of first substrate 201, with at least one interconnect 221 aligned with each connector 202 of first substrate 201. In some embodiments, anisotropic conductive film 220 may be applied at any angular offset, as would be appreciated by one of ordinary skill in the art having the benefit of this disclosure.

As shown in FIG. 1, spacing 206 of the plurality of connectors 202 of first substrate 201 and spacing 216 of the plurality of connectors 212 of second substrate 211 may each be greater than width 225 of the plurality of interconnects 221. With width 225 of the plurality of interconnects 221 less than spacing 206 and spacing 216, the plurality of interconnects 221 of anisotropic conductive film 220 can be used to electrically connect a connector 202 on first substrate 201 with a corresponding connector 212 on second substrate 211 without providing electrical communication between adjacent connectors 202 on first substrate 201 or adjacent connectors 212 on second substrate 211 through interconnect 221 in the x-direction. Likewise, as shown in FIG. 3, spacing 208 of the plurality of connectors 202 of first substrate 201 and the spacing in the y-direction of the plurality of connectors 212 of second substrate 211 (shown in FIG. 1) are each greater than width 227 of the plurality of interconnects 221, such that interconnect 221 does not provide electrical communication between adjacent connectors 202 of first substrate 201 or adjacent connectors 212 on second substrate 211 (shown in FIG. 1) in the y-direction. Spacing 206 may be equal to spacing 208. When the widths 225, 227 of the plurality of interconnects 221 are both less than the spacings 206, 208 of the connectors 202 of first substrate 201, anisotropic conductive film 220 (shown in FIG. 1) may be applied with its x-direction aligned with either the x-direction or the y-direction of the array of connectors 202 of first substrate 201, without creating a short between adjacent connectors 202. Greater tolerances may be utilized when applying anisotropic conductive film 220 (shown in FIG. 1) to first substrate 201 and second substrate 211, without shorting adjacent connectors 202, 212.

Figure 4:
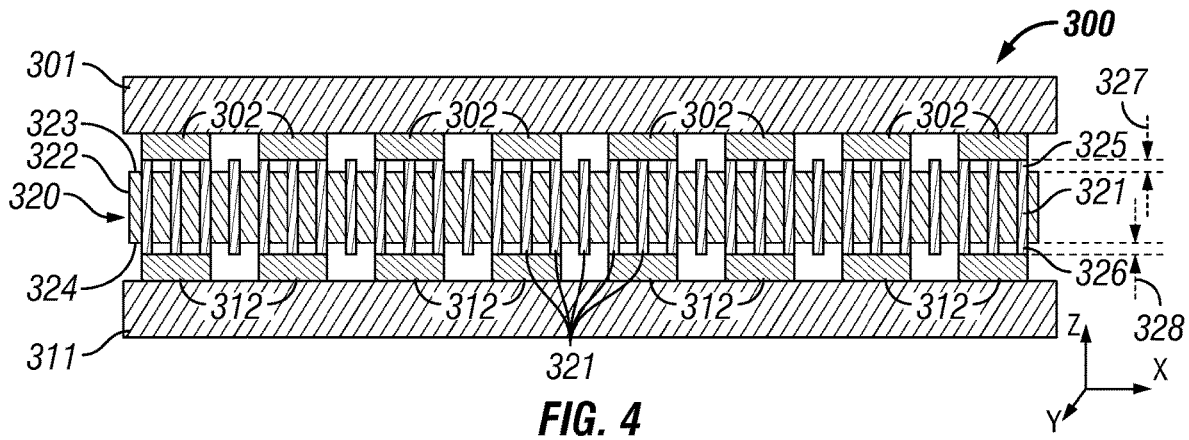
FIG. 4 is a schematic of an embodiment of a semiconductor device assembly with an anisotropic conductive film connecting a plurality of substrates.

FIG. 4 shows a schematic of an embodiment of a semiconductor device assembly 300 with an anisotropic conductive film 320 providing electrical communication between connectors 302 of a first substrate 301 and connectors 312 of a second substrate 311. The plurality of interconnects 321 are laterally separated in an electrically insulative material 322 having an upper portion 323 and a lower portion 324. Upper portion 323 does not contact connector 302 of first substrate 301 it is in proximity with and lower portion 324 does not contact connector 312 of second substrate 311 it is in proximity with. The plurality of interconnects 321 each include an upper end 325 and a lower end 326. Upper end 325 is in contact with connector 302 of first substrate 301 and lower end 326 is in contact with connector 312 of second substrate 311. Upper end 325 extends beyond upper portion 323 of electrically insulative material 322 to form an upper gap 327 between electrically insulative material 322 and connector 302 of first substrate 301. Lower end 326 extend beyond lower portion 324 of electrically insulative material 322 to form a lower gap 328 between electrically insulative material 322 and connector 312 of second substrate 311. Upper gap 327 and lower gap 328 may be equal in size.

Electrically insulative material 322 does not include an adhesive for connecting first substrate 301 and second substrate 311, and the connections between the plurality of interconnects 321 and connectors 302 of first substrate 301 and connectors 312 of second substrate 311 provide a physical connection therebetween. Additional connectors 302 of first substrate 301 may be provided for the purpose of establishing additional physical connections and may not be operable to receive or supply an electrical communication.

Figure 5:
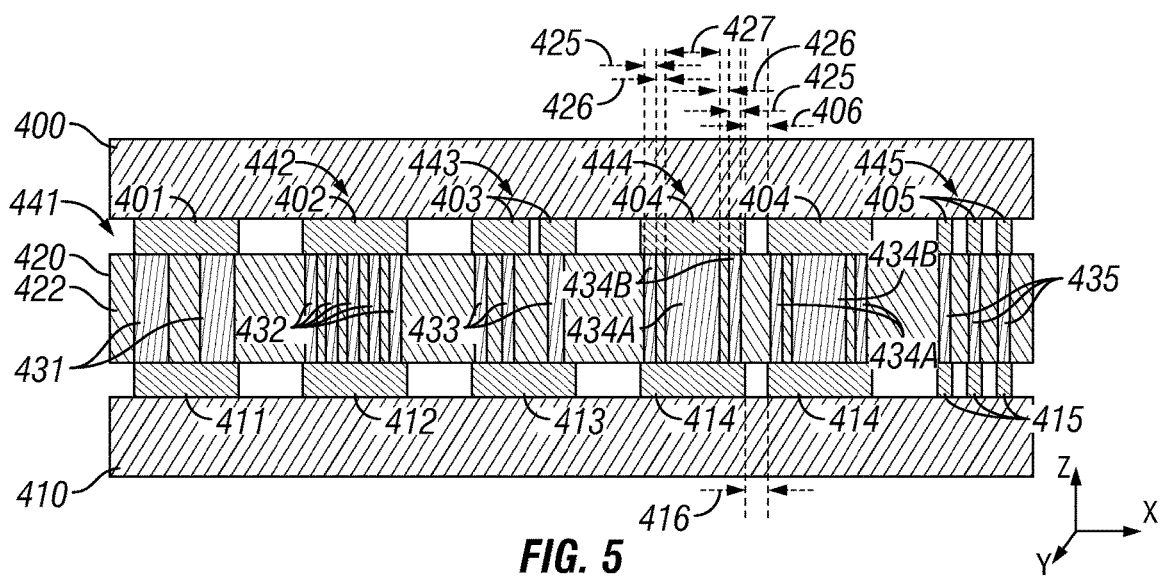
FIG. 5 is a schematic of embodiments of connectors and electrical interconnects of an anisotropic conductive film.

FIG. 5 is a schematic of embodiments of connectors and interconnects of an anisotropic conductive film 420 providing electrical communication between a first substrate 400 and a second substrate 410. For purposes of illustration, multiple embodiments have been shown laterally separated within an electrically insulative material 422 to form anisotropic conductive film 420. While some embodiments may utilize varying configurations of connectors, interconnects, widths, and spacings together in the same anisotropic conductive film, additional manufacturing advantages may be realized from utilizing a uniform configuration throughout the electrically insulative material. Accordingly, the following description should be understood to apply to embodiments utilizing a single configuration and embodiments utilizing multiple configurations.

A first configuration 441 shows two interconnects 431 providing electrical communication between a first connector 401 of first substrate 400 and a first connector 411 of second substrate 410. The width of the two interconnects 431 and the spacing therebetween are approximately equal to the width of first connector 401 of first substrate 400 and first connector 411 of second substrate 410.

A second configuration 442 shows five interconnects 432 providing electrical communication between a second connector 402 of first substrate 400 and a second connector 412 of second substrate 410. The width of the five interconnects 432 and the spacings between them are approximately equal to the width of the second connector 402 and the second connector 412. A smaller width of interconnects 432, compared to interconnects 431 of the first configuration 441, may allow adjacent second connectors 402 and adjacent second connectors 412 to have a smaller spacing without causing a short. Five interconnects 432 are used for purposes of illustration, but any plurality of interconnects 432, such as five or more interconnects 432, may be in contact with the second connector 402 and the second connector 412, as would be appreciated by one of ordinary skill in the art having the benefit of this disclosure. As the width of interconnects 432 decreases, the spacing between adjacent second connectors 402, 412 may also be decreased.

A third configuration 443 shows three interconnects 433 providing electrical communication between a third connector 403 of first substrate 400 and a third connector 413 of second substrate 410. The third connector 403 of first substrate 400 may be formed of multiple parts that are collectively operable to receive or supply an electrical communication.

A fourth configuration 444 shows a plurality of interconnects that includes a subset of first interconnects 434a and a subset of second interconnects 434b providing electrical communication between a fourth connector 404 of first substrate 400 and a fourth connector 414 of second substrate 410. Adjacent fourth connectors 404 of first substrate 400 have a spacing 406 and adjacent fourth connectors 414 of second substrate 410 have a spacing 416 that is equal to spacing 406 of first substrate 400. First interconnects 434a are positioned on opposing sides of second interconnect 434b with a spacing 426 therebetween. Second interconnect 434b has a width 427 that is greater than width 425 of the first interconnects 434a and may be configured to transmit a greater magnitude of electrical current. Width 427 of second interconnect 434b may also be greater than spacing 406 of the adjacent fourth connectors 404. Width 425 of first interconnects 434a is less than spacing 406 of the adjacent fourth connectors 404. During the application process, fourth configuration 444 may be offset by less than the sum of spacing 406 between adjacent fourth connectors 404 of first substrate 400, spacing 426 between first interconnect 434a and second interconnect 434b, and width 425 of first interconnect 434a without second interconnect 434b shorting the adjacent fourth connectors 404 or the adjacent fourth connectors 414.

A fifth configuration 445 provides electrical communication between fifth connectors 405 of first substrate 400 and fifth connectors 415 of second substrate 410 through laterally separated interconnects 435. The widths and spacings of fifth connectors 405 of first substrate 400 and fifth connectors 415 of second substrate 410 substantially corresponds to the widths and spacings of the plurality of interconnects 435. Smaller tolerances may be utilized when applying the anisotropic conductive film and the widths and spacings of fifth connectors 405 of first substrate 400 may vary. However, if a width of an interconnect 435 is greater than the spacing of adjacent fifth connectors 405 of first substrate 400, then manufacturing tolerances used should be small enough to ensure that an offset during application does not cause interconnect 435 to contact both adjacent fifth connectors 405.

Figure 6:
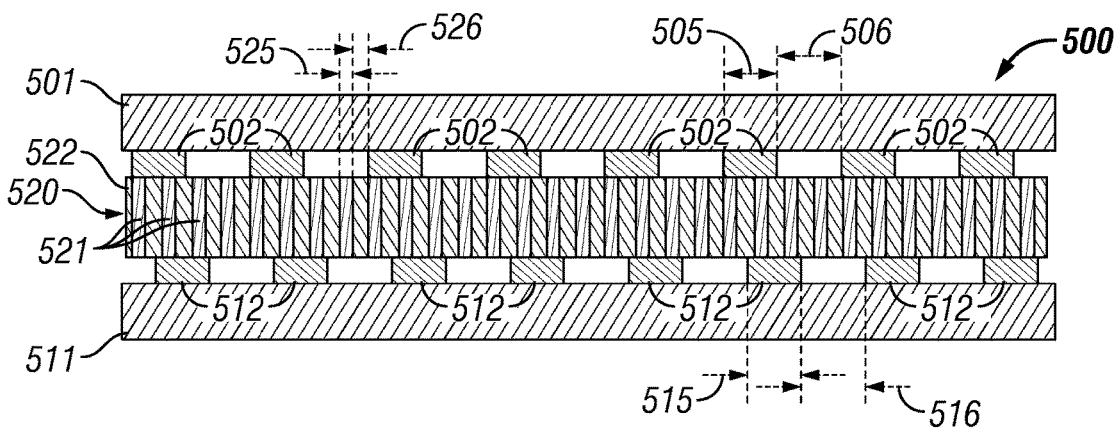
FIG. 6 is a schematic of an embodiment of a semiconductor device assembly with an anisotropic conductive film connecting a plurality of substrates.

FIG. 6 is a schematic of an embodiment of a semiconductor device assembly 500 with an anisotropic conductive film 520 providing electrical communication between connectors 502 of a first substrate 501 and connectors 512 of a second substrate 511 via a plurality of interconnects 521. The plurality of interconnects 521 are laterally separated in an electrically insulative material 522. In the x-direction, the plurality of interconnects 521 have a width 525 and a spacing 526, which is the distance between adjacent interconnects 521. The plurality of connectors 502 of first substrate 501 each have a width 505. First substrate 501 has a spacing 506, which is the distance between adjacent connectors 502 of first substrate 501. Spacing 506 between each adjacent pair of connectors 502 of first substrate 501 is uniform. The plurality of connectors 512 of second substrate 511 each have a width 515. Second substrate 511 has a spacing 516, which is the distance between adjacent connectors 512 of second substrate 511. Spacing 516 between each adjacent pair of connectors 512 of second substrate 511 is uniform. Width 505 of connectors 502 of first substrate 501 is equal to width 515 of connectors 512 of second substrate 511. Spacing 506 of connectors 502 of first substrate 501 is equal to spacing 516 of connectors 512 of second substrate 511.

During application of anisotropic conductive film 520 to first substrate 501 and second substrate 511, first substrate 501 or second substrate 511 may become misaligned in the x-direction or the y-direction (not shown). Width 505 of connectors 502 of first substrate 501, width 525 of interconnects 521, spacing 506 of connectors 502 of first substrate 501, and spacing 526 of the plurality of interconnects 521 may be selected to reduce the likelihood of shorting between adjacent connectors 502 of first substrate 501. By way of example, as the ratio of spacing 506 compared to width 515 of second substrate 511 increases, a greater misalignment may be present before shorting between adjacent connectors 502 of first substrate 501 occurs. In addition, as width 525 of the plurality of interconnects 521 decreases, a greater misalignment may be present before shorting between adjacent connectors 502 of first substrate 501 occurs.

Figure 7:
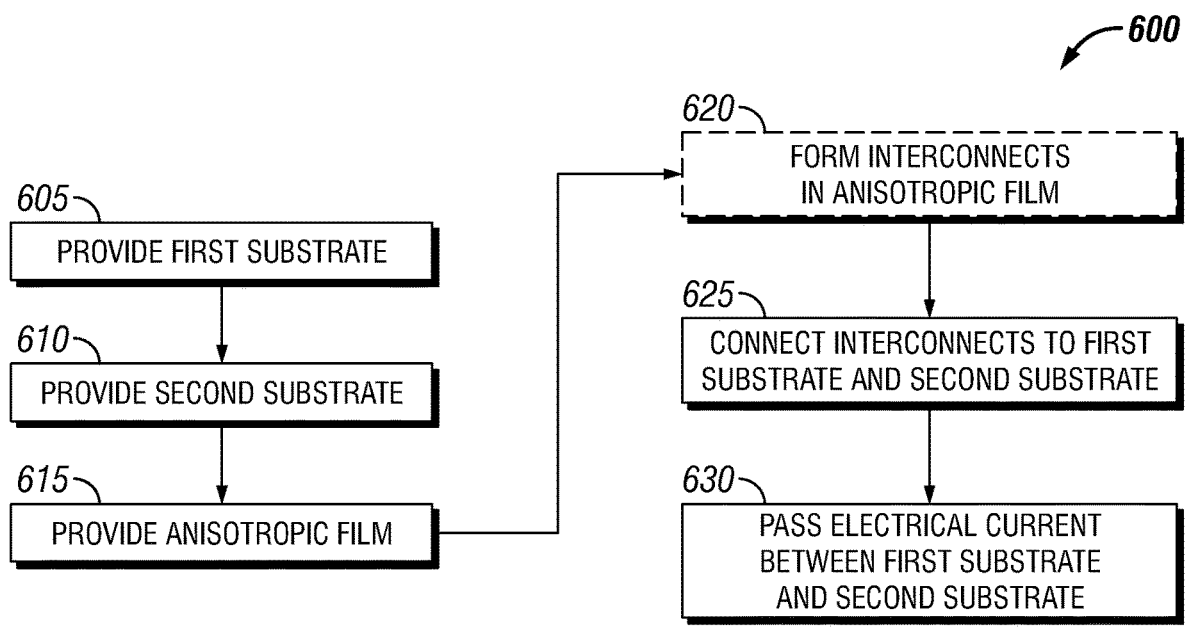
FIG. 7 is a flow chart of an embodiment of a method of making a semiconductor device assembly.

FIG. 7 is a flow chart of an embodiment of a method 600 of making a semiconductor device assembly. The method 600 includes providing a first substrate in Action 605, providing a second substrate in Action 610, and providing an anisotropic conductive film in Action 615. The first and/or second substrates may be a semiconductor device, as discussed herein. The anisotropic conductive film includes vertically oriented interconnects laterally separated by an electrically insulative material. The method 600 may include forming the plurality of interconnects in the anisotropic conductive film, in Action 620. The method 600 includes connecting the plurality of interconnects to the first substrate and the second substrate, in Action 625. One or more interconnects may be connected between corresponding connectors on the first and second substrates. In some embodiments, the anisotropic conductive film may not contain an adhesive and the method may not include adhering the anisotropic conductive film to the first substrate via an adhesive. The method 600 includes passing electrical current between the first substrate and the second substrate via the plurality of interconnects, in Action 630.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
  a first substrate having a first plurality of connectors;
  a second substrate having a second plurality of connectors; and
  a pre-channeled anisotropic conductive film having an upper portion and a lower portion, with a thickness extending between the upper portion and the lower portion, the anisotropic conductive film positioned between the first substrate and the second substrate, the anisotropic conductive film having an electrically insulative material and a plurality of interconnects laterally separated by the electrically insulative material, the plurality of interconnects forming an array of electrically conductive channels extending through the thickness of the anisotropic conductive film, the first plurality of connectors being in electrical communication with the second plurality of connectors via the electrically conductive channels, wherein the anisotropic conductive film does not include an adhesive.

2. The semiconductor device assembly of claim 1, wherein the anisotropic conductive film is a microporous film and the plurality of interconnects are pores of the microporous film.

3. The semiconductor device assembly of claim 2, wherein the electrically insulative material is acrylic-based or epoxy-based.

4. The semiconductor device assembly of claim 1, wherein the plurality of interconnects forms a plurality of electrically conductive channels extending from one of the first plurality of connectors to one of the second plurality of connectors.

5. The semiconductor device assembly of claim 1, wherein the plurality of interconnects each have a width orthogonal to the thickness of the anisotropic conductive film, the first plurality of connectors has a spacing parallel to the width of the plurality of interconnects, the spacing of the first plurality of connectors being a distance between adjacent connectors of the first plurality of connectors, the second plurality of connectors has a spacing parallel to the width of the plurality of interconnects, the spacing of the second plurality of connectors being a distance between adjacent connectors of the second plurality of connectors, and the width of at least a subset of the plurality of interconnects is less than the spacing of the first plurality of connectors and less than the spacing of the second plurality of connectors.

6. The semiconductor device assembly of claim 5, wherein the spacing of the first plurality of connectors is uniform and the width of the plurality of interconnects is uniform.

7. The semiconductor device assembly of claim 5, wherein the width of the plurality of interconnects includes a first width orthogonal to the thickness of the anisotropic conductive film and a second width orthogonal to the thickness of the anisotropic conductive film, the second width orthogonal to the first width, and wherein the spacing of the first plurality of connectors includes a first spacing parallel to the first width of the plurality of interconnects and a second spacing parallel to the second width of the plurality of interconnects, the first width of the plurality of interconnects is less than the first spacing of the first plurality of connectors, and the second width of the plurality of interconnects is less than the second spacing of the first plurality of connectors.

8. The semiconductor device assembly of claim 7, wherein the first width of the plurality of interconnects is less than the second spacing of the first plurality of connectors, and the second width of the plurality of interconnects is less than the first spacing of the first plurality of connectors.

9. The semiconductor device assembly of claim 5, wherein the first plurality of connectors each have a width parallel to the spacing of the first plurality of connectors, the plurality of interconnects has a spacing parallel to the width of the plurality of interconnects, the spacing of the plurality of interconnects being a distance between adjacent interconnects of the plurality of interconnects, and the spacing of the plurality of interconnects is less than the width of the first plurality of connectors.

10. The semiconductor device assembly of claim 9, wherein the width of the first plurality of connectors is uniform and the spacing of the plurality of interconnects is uniform.

11. The semiconductor device assembly of claim 9, wherein the spacing of the plurality of interconnects includes a first spacing and a second spacing, the second spacing orthogonal to the first spacing, and wherein the width of the first plurality of connectors includes a first width parallel to the first spacing of the plurality of interconnects and a second width parallel to the second spacing of the plurality of interconnects, the second width orthogonal to the first width, the first spacing of the plurality of interconnects is less than the first width of the first plurality of connectors, and the second spacing of the plurality of interconnects is less than the second width of the first plurality of connectors.

12. The semiconductor device assembly of claim 11, wherein the first spacing of the plurality of interconnects is less than the second width of the first plurality of connectors, and the second spacing of the plurality of interconnects is less than the first width of the first plurality of connectors.

13. A semiconductor device assembly comprising:
   a first substrate having a first plurality of connectors;
   a second substrate having a second plurality of connectors; and
   a pre-channeled anisotropic conductive film having an upper portion and a lower portion, with a thickness extending between the upper portion and the lower portion, the anisotropic conductive film positioned between the first substrate and the second substrate, the anisotropic conductive film having an electrically insulative material and a plurality of interconnects laterally separated by the electrically insulative material, the plurality of interconnects forming an array of electrically conductive channels extending through the thickness of the anisotropic conductive film, the first plurality of connectors being in electrical communication with the second plurality of connectors via the electrically conductive channels,
   wherein the plurality of interconnects each have a width orthogonal to the thickness of the anisotropic conductive film, the first plurality of connectors has a spacing parallel to the width of the plurality of interconnects, the spacing of the first plurality of connectors being a distance between adjacent connectors of the first plurality of connectors, the second plurality of connectors has a spacing parallel to the width of the plurality of interconnects, the spacing of the second plurality of connectors being a distance between adjacent connectors of the second plurality of connectors, and the width of at least a subset of the plurality of interconnects is less than the spacing of the first plurality of connectors and less than the spacing of the second plurality of connectors,
   wherein the subset of the plurality of interconnects are first interconnects, and the plurality of interconnects includes at least one second interconnect, the at least one second interconnect having a width that is greater than a width of the first interconnects, the at least one second interconnect being laterally positioned between first interconnects.

14. The semiconductor device assembly of claim 13, wherein the width of the at least one second interconnect is greater than the spacing of the first plurality of connectors.

15. An anisotropic conductive film comprising:
an upper portion;
a lower portion;
a thickness extending between the upper portion and the lower portion;
a plurality of interconnects extending from the upper portion to the lower portion, each interconnect forming an electrically conductive channel throughout the thickness before application to a substrate, the plurality of interconnects forming an array; and
an electrically insulative material, the plurality of interconnects being lateral separated by the electrically insulative material, wherein the anisotropic conductive film does not include an adhesive.

16. The anisotropic conductive film of claim 15, wherein the plurality of interconnects each have a width orthogonal to the thickness and a spacing parallel to the width of the plurality of interconnects, the spacing of the plurality of interconnects being a distance between adjacent interconnects, the width being uniform and the spacing being uniform.

17. The anisotropic conductive film of claim 16, wherein the width of the plurality of interconnects includes a first width and a second width, the second width orthogonal to the first width, and wherein the spacing of the plurality of interconnects includes a first spacing and a second spacing parallel to the second width of the plurality of interconnects, the first width being uniform, the second width being uniform, the first spacing being uniform, and the second spacing being uniform.

18. The anisotropic conductive film of claim 17, wherein the first spacing is equal to the second spacing.

19. The anisotropic conductive film of claim 15, wherein the electrically insulative material is a microporous film and the plurality of interconnects are pores of the microporous film.

* * * * *